US007990146B2

(12) United States Patent
Lazar et al.

(10) Patent No.: US 7,990,146 B2
(45) Date of Patent: Aug. 2, 2011

(54) BIRDCAGE-LIKE TRANSMITTING ANTENNA FOR MRI

(75) Inventors: Razvan Lazar, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 195 days.

(21) Appl. No.: 12/446,656

(22) PCT Filed: Apr. 2, 2008

(86) PCT No.: PCT/EP2008/053930

§ 371 (c)(1), (2), (4) Date: Apr. 22, 2009

(87) PCT Pub. No.: WO2008/122553

PCT Pub. Date: Oct. 16, 2008

(65) Prior Publication Data

US 2009/0267606 A1 Oct. 29, 2009

(30) Foreign Application Priority Data

Apr. 4, 2007 (DE) ......................... 10 2007 016 312

(51) Int. Cl.
*G01V 3/00* (2006.01)

(52) U.S. Cl. ........................................ 324/318; 324/309

(58) Field of Classification Search .......... 324/300–322; 600/407–445
See application file for complete search history.

(56) References Cited

U.S. PATENT DOCUMENTS 4,506,224 A 3/1985 Krause
4,782,298 A 11/1988 Arakawa et al.
5,347,220 A 9/1994 Van Heelsbergen
5,559,434 A 9/1996 Takahashi et al.
6,313,633 B1 11/2001 Boskamp
6,344,745 B1 2/2002 Reisker et al.
6,781,378 B2 8/2004 Eberler et al.
7,084,629 B2 8/2006 Monski, Jr. et al.
7,084,630 B2 * 8/2006 Ludwig et al. ................ 324/318
7,227,360 B2 6/2007 Jevtic et al.
7,508,212 B2 * 3/2009 Fain et al. ..................... 324/318
2004/0227515 A1 11/2004 Nistler
2010/0219834 A1 * 9/2010 Luedeke ....................... 324/318

FOREIGN PATENT DOCUMENTS

EP 0 498 539 8/1992
JP 09201346 A 8/1997
WO WO 2005/050239 6/2005
WO WO 2006/120588 11/2006

* cited by examiner

*Primary Examiner* — Brij B Shrivastav
(74) *Attorney, Agent, or Firm* — Schiff Hardin LLP

(57) ABSTRACT

A transmission antenna for magnetic resonance applications has a birdcage-like structure that includes antenna rods proceeding between first and second terminating elements respectively located at opposite ends of the antenna rods. A detuning circuit is located at the second terminating element. Either the second terminating element is formed as a completely continuous short circuit ring and the detuning circuit is arranged between the ends of the antenna rods and the second terminating element, or the second terminating element has a number of ferrule segments, between which the detuning circuit is arranged. The second terminating element has a larger cross-section than a the first terminating element.

9 Claims, 2 Drawing Sheets

BIRDCAGE-LIKE TRANSMITTING ANTENNA FOR MRI

BACKGROUND OF THE INVENTION

1. Field of the Invention

The present invention concerns a transmission antenna for magnetic resonance applications of the type having a basic configuration known as a "birdcage" antenna.

2. Description of the Prior Art

In magnetic resonance imaging, transmission and reception antennas separated from one another are used, in particular in the head area. The antennas are typically also designated as coils. Among other things, the requirement to design the transmission antennas to be detunable results due to the use of separate transmission and reception antennas.

In the prior art, transmission antennas are normally fashioned as birdcage resonators. They therefore always have two ferrules as terminating elements, wherein the ferrules are fashioned identically. In particular, the ferrules are composed of ferrule segments that are coupled with one another via ferrule capacitors. In individual cases, antennas known as TEM resonators are used as an alternative to birdcage resonators.

The transmission antennas known in the prior art operate quite well given symmetrical examination subjects and relatively low static magnetic fields (up to approximately 1.5 Tesla). However, the quality of the radio-frequency transmission field decreases given asymmetrical examination subjects and larger static magnetic fields (for example 3 Tesla and more).

SUMMARY OF THE INVENTION

An object of the present invention is to achieve a transmission antenna for magnetic resonance applications that deliver a qualitatively high-grade radio-frequency transmission field even given asymmetrical examination subjects and larger static magnetic fields.

The above object is achieved in accordance with the present invention by a transmission antenna for magnetic resonance applications, wherein the transmission antenna has multiple antenna rods, each rod extending from a first end to a second end. The antenna rods proceed substantially parallel to a central axis and are distributed around the central axis. The antenna rods are terminated at their first ends by a first terminating element, and are terminated at their second ends by a second terminating element. The first terminating element is formed as a ferrule that has a number of ferrule segments that are coupled with each other via ferrule capacitors. The transmission antenna further has a detuning circuit that detunes the transmission antenna. The detuning circuit is located at the side of the transmission antenna at the second terminating element. Either the second terminating element is formed as a completely continuous short circuit ring and the detuning circuit is arranged between the antenna rods and the second terminating element, or the second terminating element has a number of ferrule segments between which the detuning circuit is arranged, but no ferrule capacitors. The second terminating element has a larger cross-section than the first terminating element.

The transmission antenna has a radio-frequency shield radially, externally surrounding the antenna rods.

To optimize the quality of the radio-frequency transmission field, in an embodiment the antenna rods exhibit an antenna rod distance from the radio-frequency shield as viewed in the radial direction, and that the antenna rod distance varies as viewed from the first terminating element to the second terminating element. The variation can be linear.

Alternatively or additionally, the first terminating element and the second terminating element can exhibit (relative to the central axis) a first terminating element distance and a second terminating element distance from the radio-frequency shield, respectively, as viewed in the radial direction, with the terminating element distances being different from one another.

To achieve a larger cross-section, the second terminating element can have a larger axial width than the first terminating element, with the first and second terminating elements having the same radial thickness.

In principle, the transmission antenna can be fashioned as a whole-body antenna. However, it is preferably fashioned as a head coil.

The transmission antenna can in principle be tuned to any arbitrary resonance frequency. However, it is advantageously tuned to a resonance frequency that is at least as high as the Larmor frequency of hydrogen in a static magnetic field of three Tesla.

The detuning circuit advantageously includes PIN diodes, with the PIN diodes being switched to the conductive state for tuning the transmission antenna to the resonant frequency.

The transmission antenna normally has conductors to feed signals to the transmission antenna and/or to conduct signals away from the transmission antenna. The conductors are advantageously arranged on the side of the second terminating element.

DESCRIPTION OF THE PREFERRED EMBODIMENTS

Figure 1:
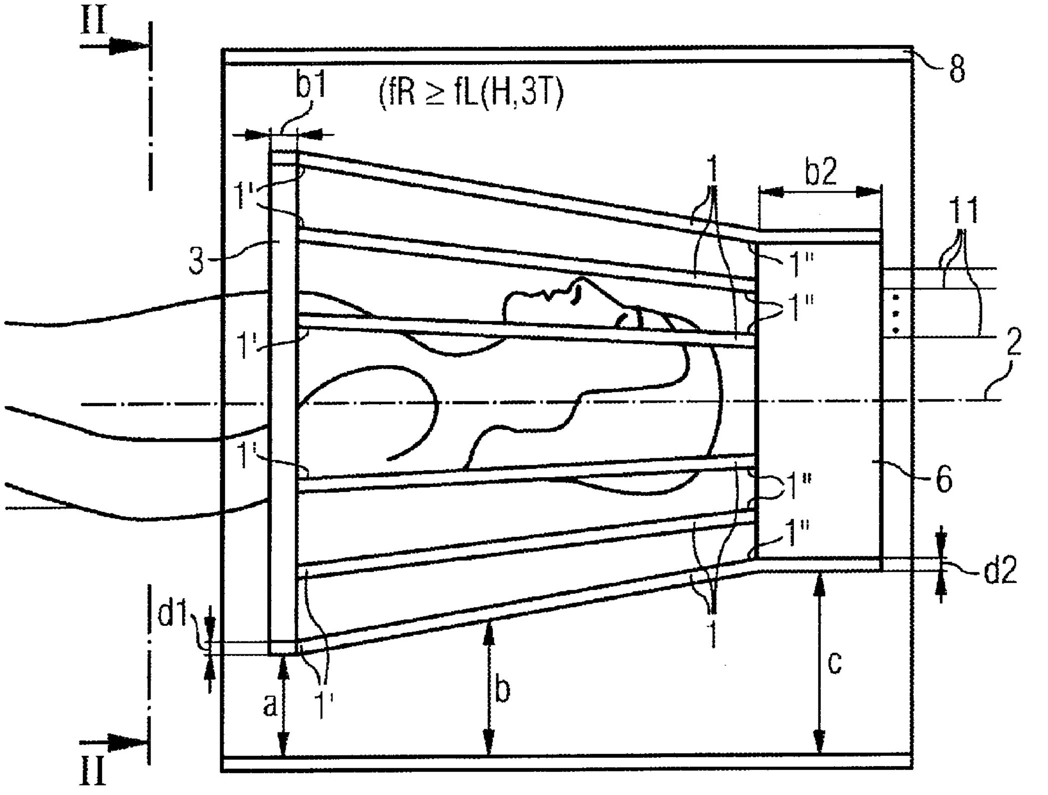
FIG. 1 schematically illustrates a transmission antenna for magnetic resonance applications, as seen from the side.
Figure 2:
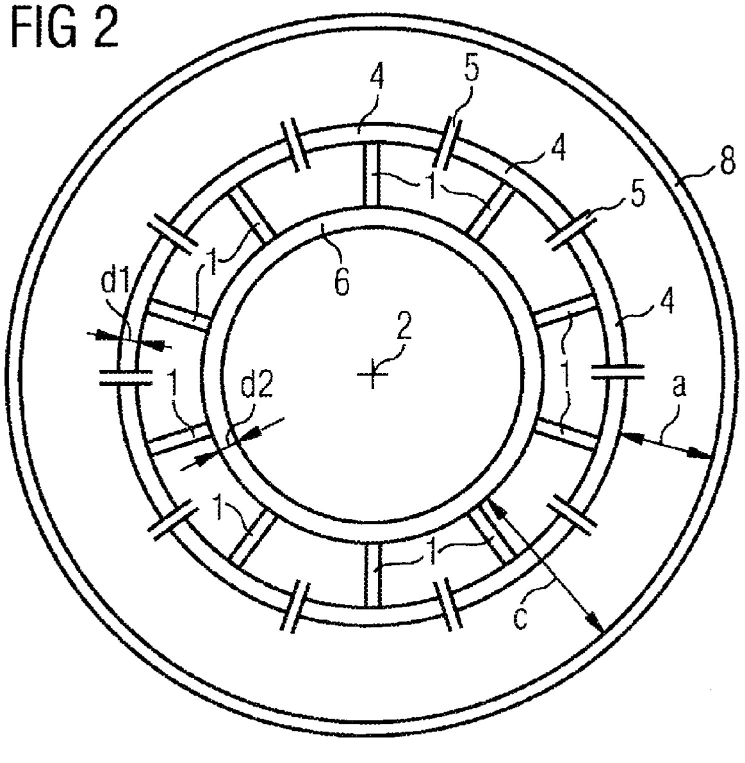
FIG. 2 shows the transmission antenna of FIG. 1 in cross-section.

According to FIGS. 1 and 2, a transmission antenna for magnetic resonance applications possesses a number of antenna rods 1. Each antenna rod 1 extends from a first end 1' to a second end 1" of the respective antenna rod 1.

In a preferred embodiment, the antenna rods 1 run (at least essentially) parallel to a central axis 2. The number of antenna rods 1 is at minimum 4. There are normally 16 or 32. However, other numbers of antenna rods 1 are also possible, for example 6, 8, 12, 24 or 40 antenna rods 1.

In the illustrated normal case, the antenna rods 1 run exactly parallel to the central axis 2. However, alternative embodiments are possible in which the antenna rods 1 define a direction that is only essentially parallel to the central axis 2. In this latter cited case, the respective antenna rod 1 exhibits a direction that possesses a first partial component and a second partial component. The two partial components complement the direction of the respective rod axis 1.

The first partial component is (exactly) parallel to the central axis 2. The second partial component is orthogonal to the central axis 2. As long as the first partial component is greater than the second partial component, the direction of the antenna rod 1 is essentially parallel to the central axis 2. For example, a curve of the antenna rods 1 essentially parallel only to the central axis 2 can result in that the transmission antenna is fashioned slightly conical (see FIGS. 1 and 2), and/or that the antenna rods 1 proceed slightly helically around the central axis 2, similar to lands and riflings of a firearm. A combination of these two measures is also possible.

For example, the transmission antenna can be fashioned as a whole-body antenna. However, it is preferably fashioned as a head coil according to FIG. 1.

The terms "axial", "radial" and "tangential" used in the following, are referenced to an axis, for example the central axis 2. The term "axial" indicates a direction parallel to the respective axis. The terms "radial" and "tangential" mean directions in a plane orthogonal to the respective axis. The term "radial" refers to a direction in this plane that is directed toward or away from the respective axis.

The term "tangential" designates a direction around the axis in the plane orthogonal to the axis. If the terms "axial", "radial" and tangential" are used without explicit reference to an axis, they refer to the central axis 2. If they should refer to a different axis, which axis this is added.

The antenna rods are terminated at their first ends 1' by means of a first terminating element 3. The first terminating element 3 is fashioned as a ferrule that has a number of ferrule segments 4. The ferrule segments 4 are coupled with one another via ferrule capacitors 5.

The antenna rods 1 are furthermore terminated at their second ends 1" by means of a second terminating element 6. According to FIGS. 1 and 2, the second terminating element 6 is fashioned as an additional ferrule. However, this is not absolutely necessary. Independent of whether the second terminating element 6 is fashioned as an additional ferrule or not, however, the second terminating element 6 is fashioned differently than the first terminating element 3. This is explained in detail in the following in connection with FIG. 1 through 4.

According to FIG. 1 the transmission antenna is tuned to a resonance frequency fR. The resonance frequency fR can in principle be arbitrary. For example, the resonance frequency fR can be at least as high as the Larmor frequency fL (H, 3 T) of hydrogen in a static magnetic field of three Tesla.

The transmission antenna furthermore has a detuning circuit 7. If the detuning circuit is not activated (detuned case), the transmission antenna is not tuned to the resonance frequency fR. It is thus not resonant at the resonance frequency fR; rather, it is detuned. In contrast to this, if the detuning circuit 7 is activated (tuned case), the transmission antenna is resonant at the resonance frequency fR; the transmission antenna is thus tuned to the resonance frequency fR.

The detuning circuit 7 is not shown in FIGS. 1 and 2. According to FIGS. 3 and 4, the detuning circuit 7 is arranged on the side of the second terminating element 6.

The basic principle of the present invention was previously explained. Possible embodiments of the present invention are subsequently explained in connection with FIG. 1 through 4.

According to FIGS. 1 and 2, the transmission antenna possesses a radio-frequency shield 8. The radio-frequency shield 8 radially, externally surrounds the antenna rods 1. The first terminating element 3 exhibits a distance a from the radio-frequency shield 8 (as viewed in the radial direction), which distance a is cited in the following as a first terminating element distance a. The antenna rods 1 furthermore exhibit a distance b from the radio-frequency shield 8 (as viewed in the radial direction), which distance b is subsequently called antenna rod distance b.

In the embodiment of FIGS. 1 and 2 (in which the second terminating element 6 is fashioned as an additional ferrule and therefore is in particular in element 6 different than the radio-frequency shield 8), the second terminating element 6 furthermore exhibits a distance c from the radio-frequency shield 8 (as viewed in the radial direction). This distance c is called the second terminating element distance c in the following.

It is possible that the antenna rod distance b is constant as viewed from the first terminating element 3 to the second terminating element 6. Such an embodiment is possible independent of whether the antenna rods 1 run parallel to the central axis 2 or—as shown in FIGS. 1 and 2 —define a frustum, for example. The transmission characteristic of the transmission antenna can, however, be optimized if the antenna rod distance b varies as viewed from the first terminating element 3 to the second terminating element 6 (as is likewise shown in FIG. 1). The antenna rod distance b can hereby in particular vary linearly. However, in individual cases a different type of variation is alternatively conceivable. For example, the radio-frequency shield 8 can run straight, and the antenna rods 1 can for example run parabolically or be otherwise curved.

In the embodiment according to FIGS. 1 and 2, in which the second terminating element 6 is an element 6 different than the radio-frequency shield 8, the second terminating element distance c can furthermore be equal to the first terminating element distance a. However, the second terminating element distance c is preferably different than the first terminating element distance a.

As an alternative to the embodiment according to FIGS. 1 and 2 (and also FIGS. 3 and 4), the second terminating element 6 can be identical with the radio-frequency shield 8. In this case the definition of a second terminating element distance is not reasonable. The remaining statements—in particular with regard to the curve of the antenna rod distance b—are still valid, however.

As already mentioned and also shown in FIG. 1 through 4, the second terminating element 6 can be fashioned as an additional ferrule. In this case the additional ferrule (=second terminating element 6) must be fashioned differently than the ferrule (=first terminating element 3). For example, the additional ferrule 6 can exhibit a larger cross-section than the ferrule 3. A larger ferrule can hereby in particular be achieved in that, although thicknesses d1, d2 of the ferrules 3, 6 are equal (as viewed in the radial direction), the additional ferrule 6 exhibits a greater width b2 (viewed in the axial direction) than the ferrule 3.

The cross-section of the additional ferrule 6 should advantageously be significantly larger than the cross-section of the ferrule 3. The term "significantly" means that the cross-section of the additional ferrule 6 is at least twice as large as the cross-section of the ferrule 3. The cross-section of the additional ferrule 6 is advantageously at least three times as large (for example four to six times as large) as the cross-section of the ferrule 3.

Due to its design (in particular due to the larger cross-section), the additional ferrule 6 (=second terminating element 6) normally exhibits a lower inductance than the ferrule 3 (first terminating element 3), but this is not absolutely necessary.

Figure 3:
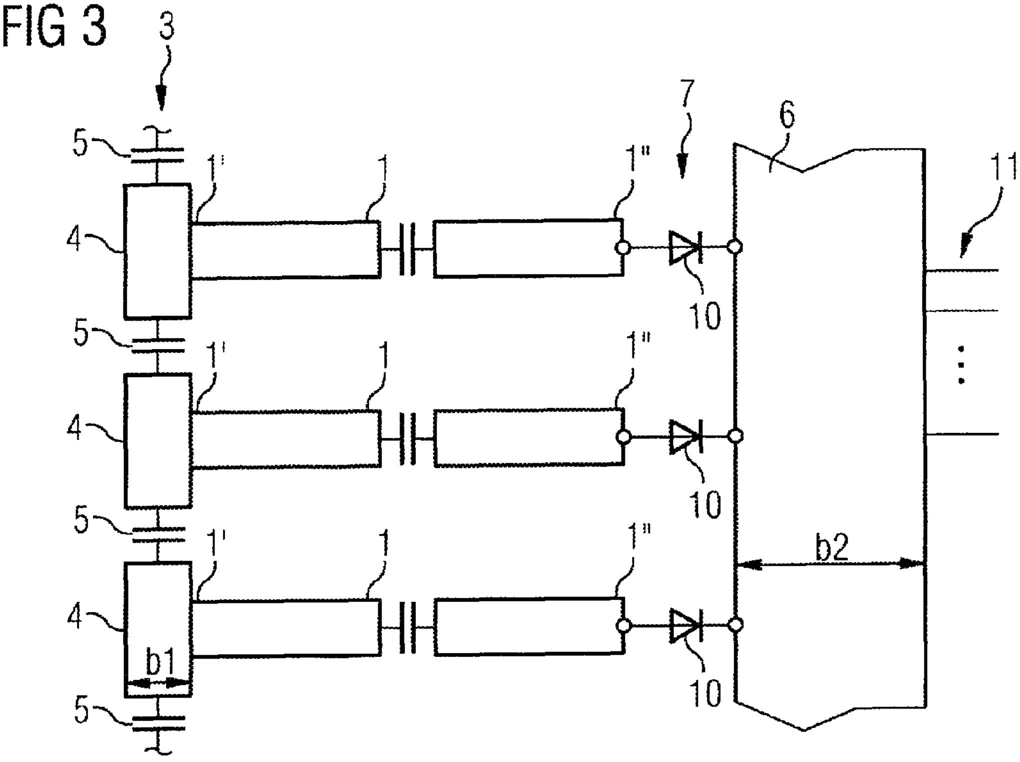
FIG. 3 shows a first embodiment of the transmission antenna of FIG. 1 in an "unrolled" representation.
Figure 4:
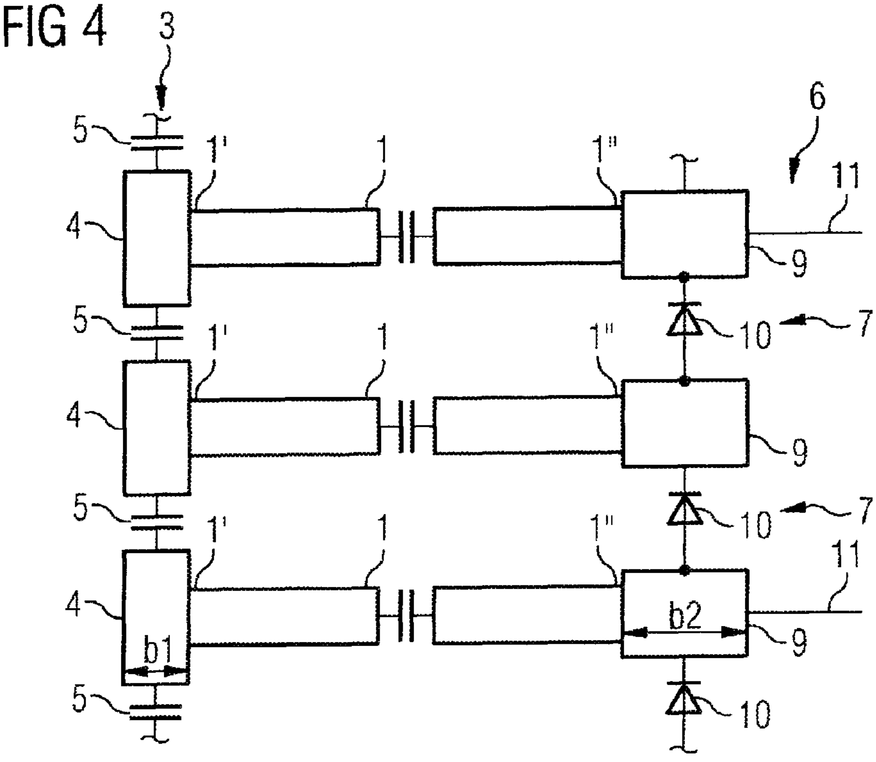
FIG. 4 shows a second embodiment of the transmission antenna of FIG. 1 in an "unrolled" representation.

As an alternative or in addition to the dimensioning of the cross-sections different from one another, the additional ferrule 6 according to FIGS. 3 and 4 can be fashioned as a continuous short circuit ring. The term "continuous short circuit ring" means either that the additional ferrule 6 (see FIG. 3) is fashioned to be entirely continuous, thus is always and unconditionally short-circuited. In this case, the detuning circuit 7 according to FIG. 3 is arranged between the antenna rods 1 and the additional ferrule 6 (=second terminating element 6). Alternatively, the term "continuous short circuit ring" can also mean that the additional ferrule 6 can in fact possess a number of ferrule segments 9 (analogous to ferrule 3). In this latter cited case, however, no ferrule capacitors are arranged between the ferrule segments 9 of the additional ferrule 6. Rather, in this case the detuning circuit 7 is arranged in the second terminating element 6. Such an embodiment is shown in FIG. 4.

The detuning circuit 7 normally has PIN diodes 10 (see FIGS. 3 and 4). If the PIN diodes 10 are not connected through, the transmission antenna is advantageously not tuned to the resonance frequency fR. However, if the PIN diodes 10 are connected through, the transmission antenna is advantageously tuned to the resonance frequency fR.

If the PIN diodes 10 are connected through, they are electrically conductive. For this reason, in the through-connected state of the PIN diodes 10 (thus in the tuned case) the additional ferrule 6 then also acts as a continuous short circuit ring if the detuning circuit 7 is arranged in the additional ferrule 6.

Signals must be supplied to the transmission antenna. These are hereby low-frequency signals. An example of such a low-frequency signal is a detuning voltage by means of which the detuning circuit 7 is controlled. However, the signals can likewise be radio-frequency signals. An example of such a signal is the transmission current that is fed into the transmission antenna. Furthermore, signals (in particular radio-frequency signals) can be conducted away from the transmission antenna. An example of such a signal is the signal received by the transmission antenna in the event that the transmission antenna can also be operated as a reception antenna. An additional example of radio-frequency signals to be conducted away are microwave signals that are received by microwave receivers which are integrated into the antenna rods 1. The microwave receivers are not shown in the figures.

The supply and discharge of the aforementioned signals ensues via conductors 11. According to FIGS. 1 through 4, the conductors 11 are advantageously arranged on the side of the second terminating element 6. However, this is not absolutely necessary.

The transmission antenna of the present invention possesses many advantages. It is in particular simple in design, highly effective and can be flexibly dimensioned and used.

Although modifications and changes may be suggested by those skilled in the art, it is the intention of the inventors to embody within the patent warranted heron all changes and modifications as reasonably and properly come within the scope of their contribution to the art.

We claim as our invention:

1. A transmission antenna for magnetic resonance applications, comprising:

an antenna structure comprising a plurality of antenna rods, each having a first end and a second end, said antenna structure having a central axis and said antenna rods being distributed around, and parallel to, said central axis;

said antenna structure further comprising a first terminating element that terminates said antenna rods at the respective first ends thereof, and a second terminating element that terminates said antenna rods at the respective second ends thereof;

said first terminating element being formed as a ferrule comprising a plurality of ferrule segments that are coupled to each other via ferrule capacitors;

a detuning circuit that is operable to detune said antenna structure, said detuning circuit being located at said second terminating element;

either said second terminating element being formed as a completely continuous short circuit ring and said detuning circuit being located between the respective second ends of the antenna rods and the second terminating element, or the second terminating element comprising a plurality of ferrule segments and no ferrule capacitors, with said detuning element being disposed between said ferrule segments; and said second terminating element having a larger cross-section than said first terminating element.

2. A transmission antenna as claimed in claim 1 comprising a radio-frequency shield disposed radially relative to said central axis and externally surrounding said antenna rods.

3. A transmission antenna as claimed in claim 2 wherein said antenna rods are each located at an antenna rod distance from the radio-frequency shield in a radial direction relative to the central axis, and wherein said antenna rod distance varies from said first terminating element to said second terminating element.

4. A transmission antenna as claimed in claim 2 wherein said first terminating element is located at a first terminating element distance from said radio-frequency shield in a radial direction relative to the central axis, and wherein said second terminating element is located at a second terminating element distance from the radio-frequency shield in said radial direction relative to the central axis, and wherein said first terminating element distance is different from said second terminating element distance.

5. A transmission antenna as claimed in claim 1 wherein said second antenna terminating element has a greater axial width, relative to the central axis, than said first terminating element, and wherein said first and second terminating elements have equal radial thicknesses.

6. A transmission antenna as claimed in claim 1 wherein said antenna structure is configured as a head coil.

7. A transmission antenna as claimed in claim 1 wherein said antenna structure is tuned to a resonance frequency of a magnetic resonance apparatus, said resonance frequency being at least as large as the Larmor frequency of hydrogen in a static magnetic field of three Tesla.

8. A transmission antenna as claimed in claim 1 wherein said detuning circuit comprises PIN diodes, and wherein said antenna structure is tuned to a resonance frequency when said PIN diodes are in a conducting state.

9. A transmission antenna as claimed in claim 1 comprising conductors connected to said second terminating element configured to supply signals to said antenna structure and tap signals from said antenna structure.

* * * * *